United States Patent
Pant et al.

(10) Patent No.: US 7,573,691 B2
(45) Date of Patent: Aug. 11, 2009

(54) ELECTRICAL OVER STRESS ROBUSTNESS

(75) Inventors: Sandeep Pant, Orefield, PA (US); Gary H. Weiss, Slatington, PA (US); David W. Thompson, Macungie, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 160 days.

(21) Appl. No.: 10/821,836

(22) Filed: Apr. 12, 2004

(65) Prior Publication Data

US 2005/0225912 A1 Oct. 13, 2005

(51) Int. Cl.
*H02H 3/22* (2006.01)
(52) U.S. Cl. .......... 361/111; 361/56; 361/91.1; 361/117; 361/118; 361/119
(58) Field of Classification Search ............. 361/56, 361/96, 111, 119, 91.1
See application file for complete search history.

(56) References Cited

U.S. PATENT DOCUMENTS

| | | | | |
|---|---|---|---|---|
| 5,030,845 A | * | 7/1991 | Love et al. | 327/143 |
| 5,239,440 A | | 8/1993 | Merrill | |
| 5,345,357 A | | 9/1994 | Pianka | |
| 5,903,419 A | * | 5/1999 | Smith | 361/56 |
| 5,946,177 A | * | 8/1999 | Miller et al. | 361/56 |
| 6,385,021 B1 | * | 5/2002 | Takeda et al. | 361/56 |
| 6,552,886 B1 | * | 4/2003 | Wu et al. | 361/56 |
| 6,639,771 B2 | * | 10/2003 | Li | 361/56 |
| 2002/0024791 A1 | * | 2/2002 | Whitney et al. | 361/119 |

OTHER PUBLICATIONS 1991-079049, Feb. 1991, Derwent.*

* cited by examiner

*Primary Examiner*—Fritz M Fleming
*Assistant Examiner*—Terrence R Willoughby
(74) *Attorney, Agent, or Firm*—Mandelsohn & Drucker & Associates, PC; Steve Mendelsohn

(57) ABSTRACT

Protection is provided against electrical surges resulting from Electrical Over Stress conditions, e.g., when interfacing circuits with powered connections. An EOS shunt is activated for as long as the EOS condition exists. EOS protection using an EOS shunt in accordance with the principles of the present invention remains activated by a voltage threshold trigger as long as necessary. In a disclosed embodiment, an EOS shunt includes a voltage threshold detector that detects a voltage on a power bus with respect to a ground rail exceeding a predetermined amount, e.g., 5 volts in a device powered at 3.3 volts. During the EOS event, a path between power and ground comprising a transistor is turned on.

13 Claims, 6 Drawing Sheets

ELECTRICAL OVER STRESS ROBUSTNESS

BACKGROUND OF THE INVENTION

1. Field of the Invention

This invention relates to integrated circuits (ICs). More particularly, it relates to a design technique and method to better protect electrical circuits such as an integrated circuit from electrical over stress (EOS) damage, particularly useful in the design of a IEEE 802A "Firewire" high speed serial interface.

2. Background of Related Art

The "Firewire" interface is a high performance serial bus developed by Apple Computer and Texas Instruments, and standardized as the IEEE 1394a standard. The Firewire interface as currently standardized can connect up to 63 devices in a tree-like daisy chain configuration, and transmit data at up to 400 megabits per second (Mb/s). The Firewire high speed serial interface bus is now implemented in many personal computer systems that support plug and play and peer-to-peer communication between peripheral devices.

The Firewire interface is often used with digital video devices because of the need to transfer extremely large amounts of data in real time as a videotape is played. To upload a digital movie from a digital video camera to a typical personal computer, the digital video camera may be temporarily plugged into a Firewire interface port on the PC or other computing device.

The Firewire interface is capable of passing extremely large amounts of data. However, as the inventors of the present application have appreciated, Firewire devices are prone to electrical over stress damage. This is because when a 'hot' or powered device is plugged into another device, all connections in the Firewire cable are designed for substantially simultaneous contact. In reality, the cable may be inserted at a slight angle by the unwary user, thus making contact with some connections in the Firewire cable slightly before others.

Ideally, a ground wire should be the first connection to make contact, thus providing an electrical sink for any current that may be passed on signal connections. However, Firewire cables are not designed to ensure grounded contact before other electrical connections are made.

FIG. 6 shows a conventional Firewire circuit that is susceptible to damage due to electrical over stress conditions.

In particular, as shown in FIG. 6, a Firewire interface plug 300 in a device such as a personal computer (PC) has multiple connections, including power and signal connections that are carried through a suitable Firewire cable to another Firewire device (e.g., a digital video camera). The Firewire interface plug 300 includes connections such as (8 volt-30 volt) power Vdd 301, an electrical ground Vg or Vss 303, and a plurality of input and output signals, only one of which TPout 302 is represented in FIG. 3 for clarity.

If the unregulated power supply line (up to 30 volts) 301 of the Firewire connector 'makes' (or connects) first followed by connection of the signal pin (e.g., TPout 302), before the board/integrated circuit ground connection 303 is made, the voltage regulator 310, being absent of a ground, will likely pass a 30 volt signal to the Vdd of the integrated circuit for some short period of time. In such a situation, the integrated circuit output pin TPout 302 will become an alternate ground for this 30 volt signal, with current flowing through the diode D1.

Electrostatic Discharge (ESD), another potentially harmful electrical signal, has been accommodated in many conventional integrated circuits, ICs, including those relevant to a Firewire device. For instance, the conventional IC shown in FIG. 6 includes an Electrostatic Discharge shunt 307.

If present, the ESD shunt 307 is turned on such as by an RC time constant-based control, and typically shunts power to ground for a very short period of time appropriate for ESD events. Activation of an ESD shunt 307 for approximately 2 microseconds is typical in the event of an EOS event. During these 2 microseconds, the ESD shunt 307 will partially clamp the voltage. An ESD shunt 307 must operate for a short period of time, to then allow the circuit to properly power up afterwards.

ESD shunts 307 are suitable and appropriate for shunting surges associated with ESD events. The present inventors have appreciated another electrical stressing event, electrical over stress and have presented a technique which solves problems associated therewith.

In particular, electrical over stress conditions are different from ESD events. One possible set of conditions arises from differences in the order in which connections are made between conductors of a cable and a connector to which the cable is being mated. Either the cable or the connector may be powered. Although cable connections can be performed quickly, EOS conditions nevertheless cause serious damage not solved by conventional ESD protection.

For instance, if an electrical over stress event lasts longer than 2-3 microseconds (which it typically does), full ungrounded supply voltage will be applied between the integrated circuit power rail Vdd and the signal pin TPout as shown in FIG. 6. This causes electrical over stress in transistor P1, diode D2, or both. Eventually, damage may also occur in the OUT drive circuits 320 themselves.

Conventional electrostatic discharge shunts or clamps 307 are designed to handle an ESD event, and are not suitable for alleviating the potential for damage resulting from a typical EOS event. Conventional ESD voltage triggered clamps 307 are based on RC time constants relative to the duration of a typical ESD event. Thus, ESD clamps 307 are adequate only for ESD protection, since ESD voltage spikes typically last only a few microseconds.

However, ESD is typically a very short term event, whereas electrical over stress in comparison can be a much longer term event.

Nevertheless, Firewire has become a well-followed standard, particularly among digital video devices and personal computers. Thus, the design of the now well-standardized Firewire cable cannot easily be changed without making obsolete many, many devices already in the marketplace.

There is a need to accommodate and improve upon the danger of electrical over stress damage caused by the insertion and unplugging of a cable, particularly a serial data cable such as a Firewire cable.

SUMMARY OF THE INVENTION

In accordance with the principles of the present invention, an integrated circuit including an electrical over stress shunt comprises a voltage threshold detector to detect an electrical over stress event wherein a potential is measured between a higher voltage rail such as a power rail and a lower voltage rail such as a ground rail in excess of a predetermined voltage. A switchable low resistance path is implemented between the power rail and the ground rail. The low resistance path is adapted to be switched ON for the duration of the electrical over stress event.

In accordance with another aspect of the present invention, a power distribution system in an integrated circuit comprises a power rail, a ground rail, and an electrical over stress shunt.

The EOS shunt is connected between the power rail and the ground rail. The electrical over stress shunt is capable of causing a low resistance path to be turned on between the power rail and the ground rail for the entire duration when the potential of the power rail becomes greater than the potential of the ground rail by more than a predetermined threshold.

Yet another aspect of the invention provides a method of providing robustness to an electrical circuit, including but not limited to a circuit board having discrete components thereon, from an electrical over stress event. The method comprises detecting an EOS condition wherein the potential of a power rail of the electrical circuit becomes greater than the potential of a ground rail of the electrical circuit by more than a predetermined threshold. A low resistance path is turned ON between the power rail and the ground rail for the duration of an occurrence of the detected EOS condition.

BRIEF DESCRIPTION OF THE DRAWINGS

Features and advantages of the present invention will become apparent to those skilled in the art from the following description with reference to the drawings, in which.

DETAILED DESCRIPTION OF THE ILLUSTRATIVE EMBODIMENTS

The present invention provides protection for integrated circuits against electrical surges resulting from electrical over stress type conditions, e.g., when interfacing to a circuit including power connections electrical over stress can be improved by forcing the large currents that occur as a result of a late system ground to flow through a clamp implemented between the power rail Vdd and the ground rail Vss. The electrical over stress protection is triggered by a predetermined voltage threshold, and thus is activated for as long as the electrical over stress condition exists. ESD protection may additionally be implemented, but ESD protection is typically triggered based on an RC time constant that turns the ESD protection off after no more than about 2 microseconds. An ESD shunt will not protect integrated circuits from electrical over stress. EOS protection using an EOS shunt in accordance with the principles of the present invention remains activated by a voltage threshold trigger as long as necessary.

In a disclosed embodiment, an EOS shunt includes a voltage threshold detector that detects a voltage on a higher potential rail such as a power rail with respect to a lower potential rail such as a ground rail exceeding a predetermined amount, e.g., 5 volts in a device powered at 3.3 volts. During the EOS event, a path between power and ground comprising a transistor is turned on.

Figure 1:
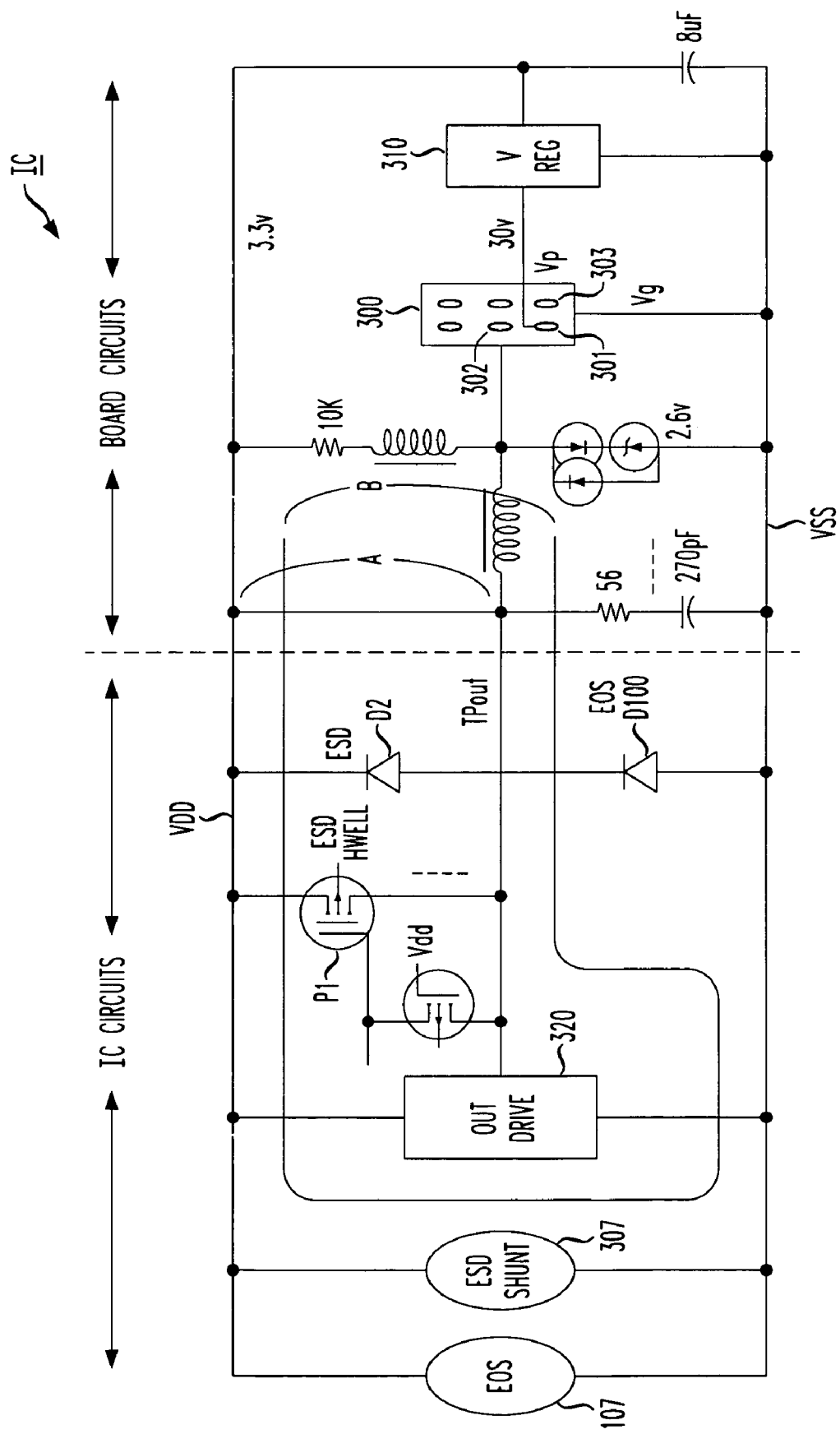
FIG. 1 shows an exemplary schematic level circuit design of a portion of an integrated circuit including an electrical over stress shunt to fortify a circuit connected to an external interface (e.g., a Firewire interface in the disclosed embodiments) to better avoid damage caused by electrical over stress conditions caused by the insertion and removal operations of a cable connected thereto, in accordance with the principles of the present invention.

FIG. 1 shows an exemplary schematic level circuit design of a portion of an integrated circuit including an electrical over stress shunt 107 to fortify a circuit connected to an external interface (e.g., a Firewire interface in the disclosed embodiments). However, the invention is not limited thereto. The EOS shunt 107 avoids damage caused by electrical over stress conditions caused by the insertion and removal operations of a cable connected thereto, in accordance with the principles of the present invention.

In particular, as shown in FIG. 1, an EOS shunt 107 is implemented between a power rail Vdd and a ground rail Vss. A conventional ESD shunt 307 may also be implemented to protect against ESD events.

Figure 6:
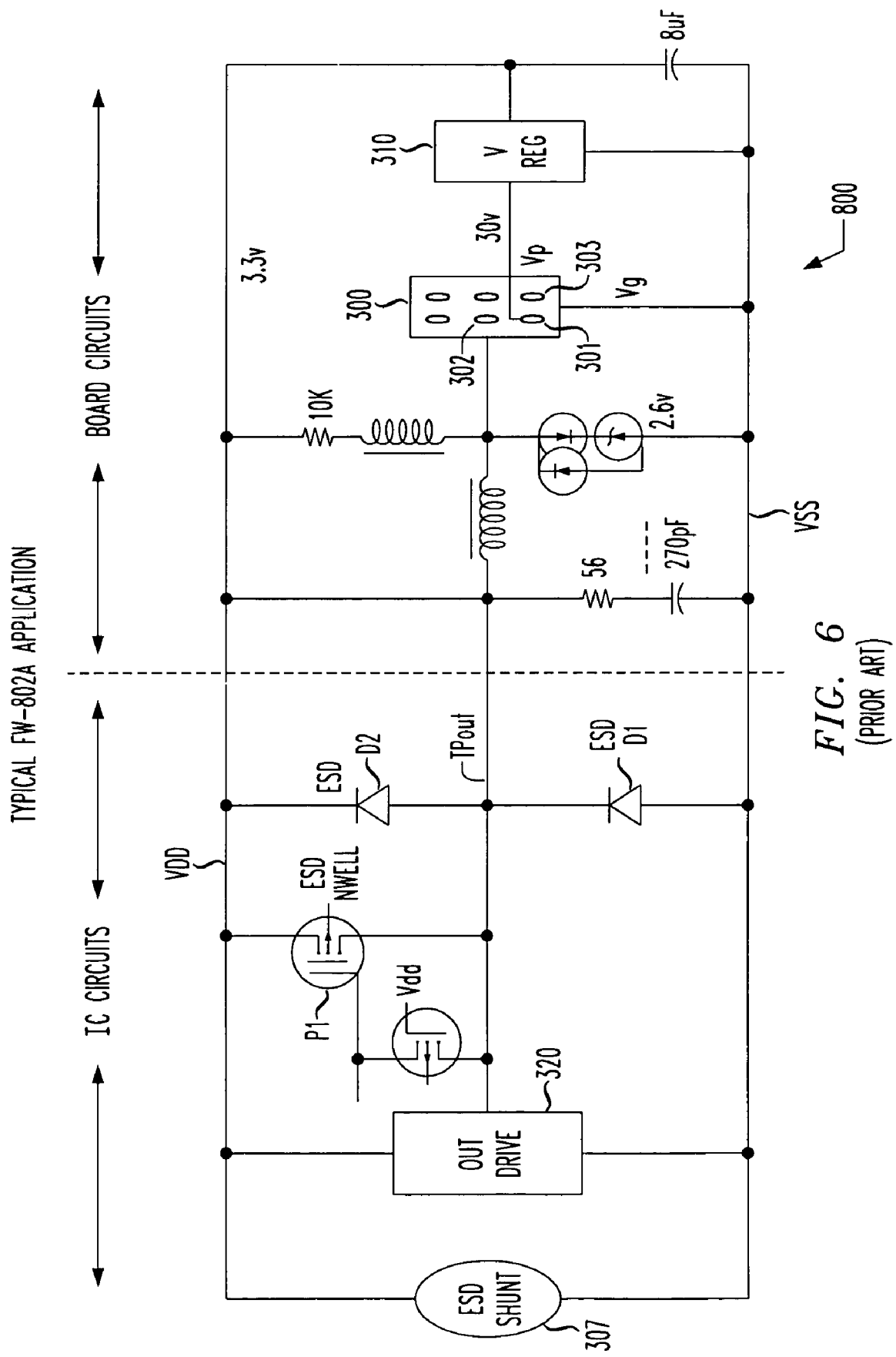
FIG. 6 shows a conventional Firewire circuit that is susceptible to damage due to electrical over stress conditions.

Important to the invention is the inclusion of an electrical over stress shunt 107 between a power rail Vdd and ground Vss. Ancillary to the inclusion of an EOS shunt 107 is the need to enhance the current carrying circuitry sufficient to handle a significant EOS event. Thus, power rail Vdd, ground rail Vss, EOS diode D100, etc. must be suitably sized to handle significant current as may be present during an EOS event. For instance, the heat generated in diode D1 due to an EOS event of, e.g., up to 4,000 microseconds would likely exceed the diode rating destroying a typical ESD diode D1 such as the one shown in prior art FIG. 6.

To handle higher current loads for longer periods of time under EOS event conditions, a sufficiently large diode D100 as shown in FIG. 1 is implemented between the ground rail and each relevant signal line such as Tpout 302. In the event that ESD protection is included in the relevant signal, the EOS diode D100 is an enlarged version of what would otherwise be an ESD diode D1 as shown in the conventional prior art design of FIG. 6.

In accordance with the principles of the present invention, an EOS diode D100 is established at the best or even more preferably at the only possible return path for an input power signal, e.g., 30 volt current to each particular signal line. In the example of FIG. 1 showing a single signal line Tpout 302, the EOS diode D100 is implemented between the output signal Tpout 302 and Vss, ground in the given example.

The EOS diode D100 in the exemplary embodiment is a solid-state diode such as silicon having a turn-on voltage of approximately 0.7 volts. However, the EOS diode D100 is larger than an otherwise conventional ESD diode D1 because it should be sized to handle significant current loads for significantly longer periods of time than a typical ESD event lasts. Thus, it is preferred that the EOS diode D100 have a larger area, and concomitantly a smaller forward resistance, as compared to an otherwise conventional ESD diode D1.

ESD diode D2, only one of which is shown in FIG. 1 may or may not be implemented on all lines, depending upon ESD and other requirements of a particular application. However, in accordance with the principles of the present invention, it is preferred that an EOS diode D100 be implemented between the ground rail and all signal lines that are connected to the relevant interface connection, e.g., Firewire connector 300 in the illustrated embodiment.

In accordance with the principles of the present invention, multiple EOS shunts 107 may be placed at various locations on an integrated circuit, in the same fashion as multiple ESD shunts 307 are conventionally placed at various locations on an integrated circuit. EOS shunts 107 are placed between a power rail and a ground rail.

During an EOS event, the EOS diode D100 becomes forward biased from the ground rail Vss and otherwise finds an alternate ground back through the signal line TPout in the Firewire cable to an established ground on the other end of the Firewire cable.

It is preferred that the EOS diode D100 be implemented as a suitably large diode to handle the relevant power. For instance, in the example of a Firewire system, the EOS diode D100 should have a low forward resistance, to withstand as much of the potentially damaging EOS current as possible.

The duration of an electrical over stress event is indeterminate, but is typically substantially longer than the duration of an ESD event. Thus, it is preferred that a voltage triggered clamp be implemented that triggers only for a signal in excess of 5 volts in the given example of a 3.3 volt application. One skilled in the art would know how to select a voltage trigger level for the operating voltage of other applications. A typical voltage trigger level would be approximately 1.5 times the operating voltage Vdd.

In the embodiments disclosed thus far, the EOS diode D100 is implemented in an integrated circuit (IC) along with other circuitry. In a more cumbersome example, the EOS diode D100 may be implemented in a discrete component along with the other board circuitry, so long as an EOS diode D100 is implemented for each signal line relevant to the integrated circuits. This would preferably include unused signal lines, as well as signal lines.

Figure 2:
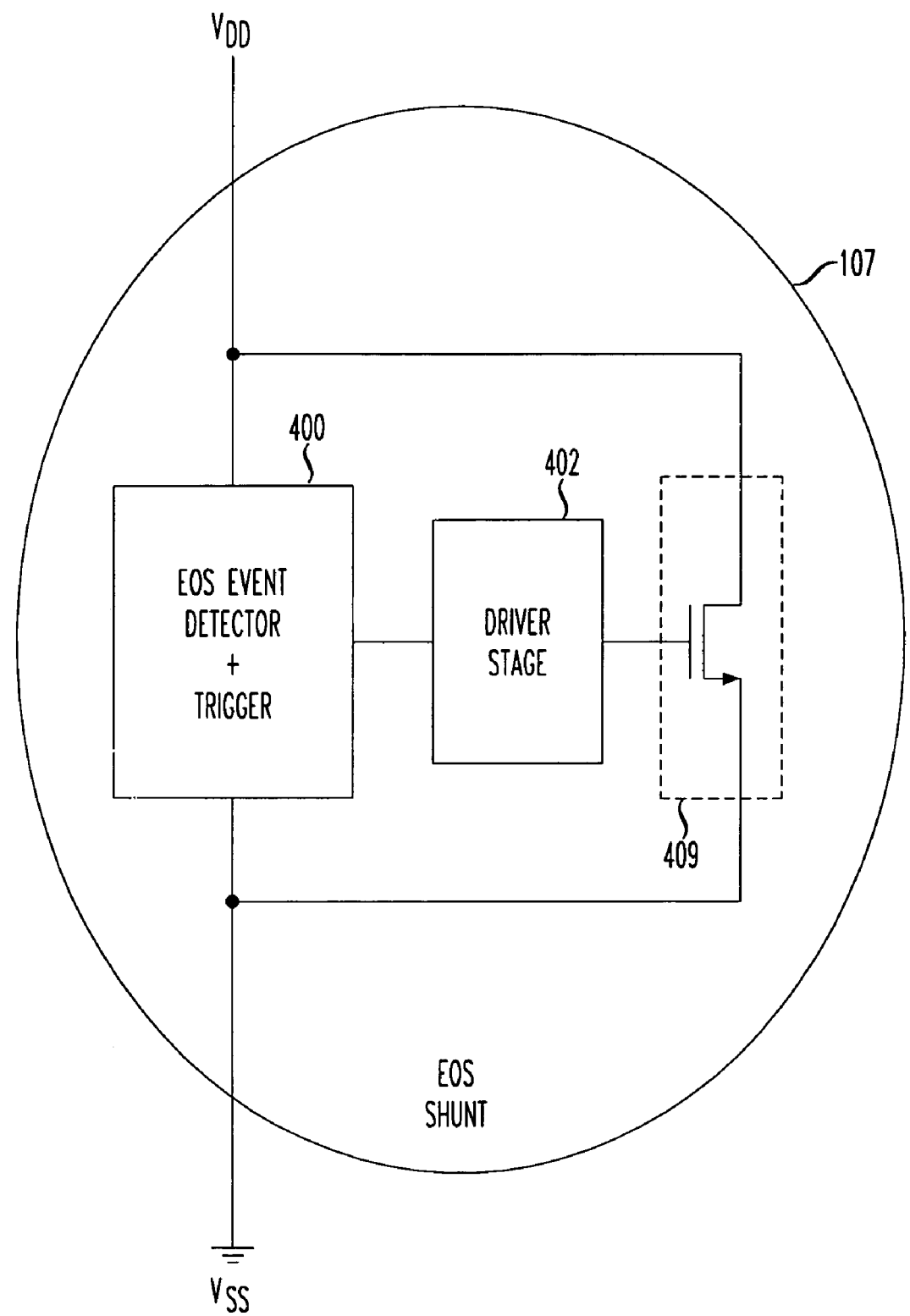
FIG. 2 shows a block diagram of an exemplary electrical over stress shunt in the integrated circuit shown in FIG. 1.

FIG. 2 shows a block diagram of an exemplary electrical over stress shunt in the integrated circuit shown in FIG. 1.

In particular, as shown in FIG. 2, an exemplary EOS shunt 107 includes an EOS event detector and trigger 400, which turns a current shunt 409 on during an EOS event, and off otherwise. The current shunt 409 may be comprised of a suitably sized transistor (e.g., a MOSFET transistor as shown).

A driver stage 402 is preferably implemented between the EOS event detector and trigger 400 and the current shunt 409. The driver 402 provides a degree of buffering in the control and activation of the current trigger 409. The EOS shunt 107 may be implemented within the architecture of an integrated circuit as shown in the disclosed embodiment of FIG. 1.

In accordance with the present invention, an EOS shunt as disclosed herein may also be packaged as a discrete element to be placed between the power and ground lines of a given circuit. Ideally, such a discrete EOS shunt would be packaged such that it can be easily placed close to the target IC or other circuit components that it is intended to protect. The farther from the target IC or other circuit components that the discrete EOS shunt is placed, the longer the EOS voltage level will be applied to the more sensitive integrated circuitry or other circuit components.

Figure 3:
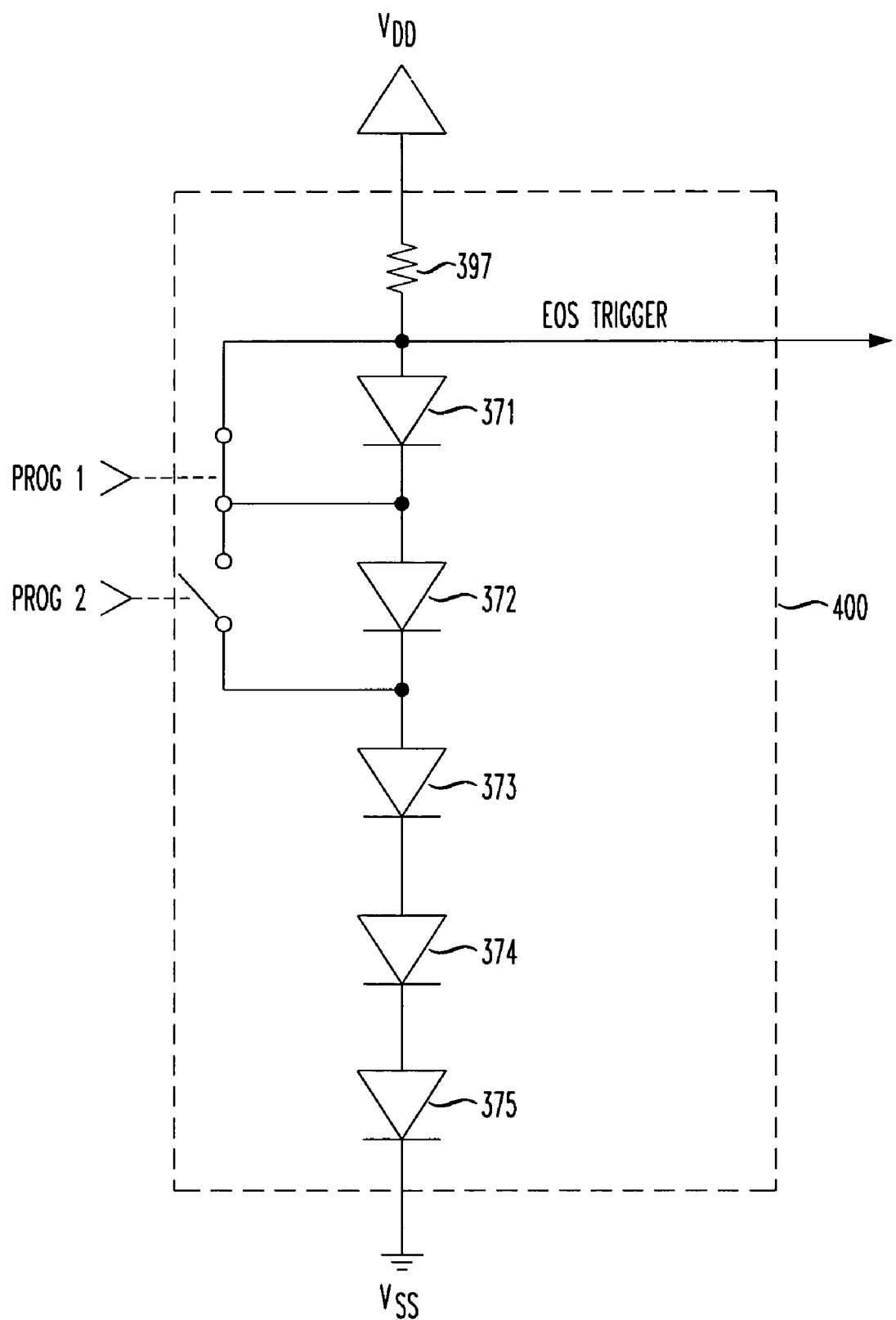
FIG. 3 shows an exemplary circuit level design of a suitable electrical over stress (EOS detector and trigger, in the EOS shunt of an integrated circuit shown in FIG. 1.

FIG. 3 shows an exemplary circuit level design of a suitable electrical over stress detector and trigger, in the EOS shunt of an integrated circuit shown in FIG. 1.

In particular, as shown in FIG. 3, the EOS event detector and trigger 400 measures the presence of a predetermined voltage with respect to ground Vss. The exemplary embodiment shown in FIG. 3 accomplishes the detection of the presence of at least this given voltage threshold indicating an EOS event by providing a series connection of a plurality of diodes 371-375. As is known in the art, the diodes can be two terminal components or diode-connected MOSFET transistors. To provide flexibility in circuit designs, at least one or more of the diodes 371, 372 may be included or excluded from the series circuit. In the given embodiment for use in a Firewire circuit, a series connection of four diode-connected MOSFET transistors as diodes 372-375 was found to be suitable, which detected a voltage of about 4 times the threshold voltage of a single diode. Various voltage thresholds are possible and within the scope of the present invention. The number of diodes in series will vary by application. This will be the case for circuits using various voltage levels for a power source.

The resistive element 397 is suitably sized to provide adequate current to the diodes 371-375. In certain low power applications, it is preferred to minimize the current draw by the EOS event detector and trigger 400. It may also be preferred to provide programmability to the resistance of resistor 397, particularly if programmability is provided in setting the number of diodes 371-375 that are active in the series connection. Exemplary values of resistor 397 were 30K to 50K ohms, though other resistance values are within the scope of the present invention.

Note that the EOS event detector and trigger 400 is turned ON as long as a voltage exceeding the predetermined value exists, e.g., 5 v, is present. Thus, an entire EOS event can be shunted, securely and reliably protecting a relevant circuit such as a Firewire circuit from damage. Protection of less than all of the duration of the EOS event would subject the protected circuit to damage nonetheless. Shunts operating from an RC-type trigger such as are found in conventional ESD shunts do not protect reliably against significantly longer EOS events.

Figure 4:
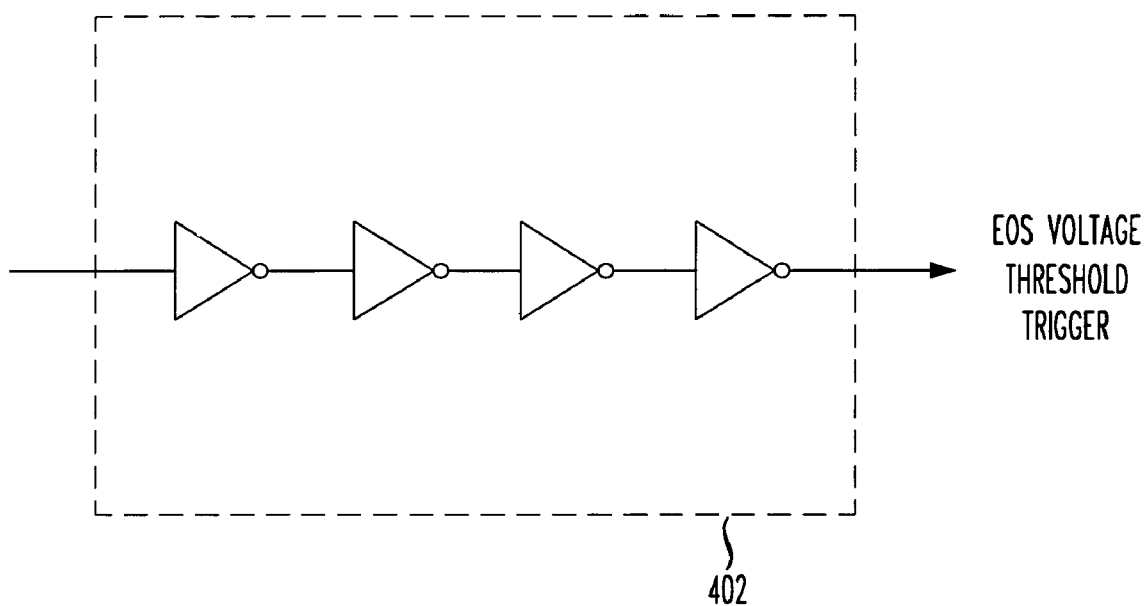
FIG. 4 shows an exemplary circuit level design of a driver stage shown in the electrical over stress shunt in an integrated circuit shown in FIG. 1.

FIG. 4 shows an exemplary circuit level design of a driver stage shown in the electrical over stress shunt in an integrated circuit shown in FIG. 1.

In particular, as shown in FIG. 4, the driver 402 is comprised of a series connection of inverters. In the given example, four inverters were used. As is known in the art, fewer or more inverters may be implemented in a driver stage, or other elements may be added or substituted. For instance, an RC based driver stage may be implemented. For the purposes of integrated circuit design, a driver using inverters is simplest and most efficient, and therefore preferred. Successive inverter stages are typically implemented with progressively larger current drive.

Figure 5:
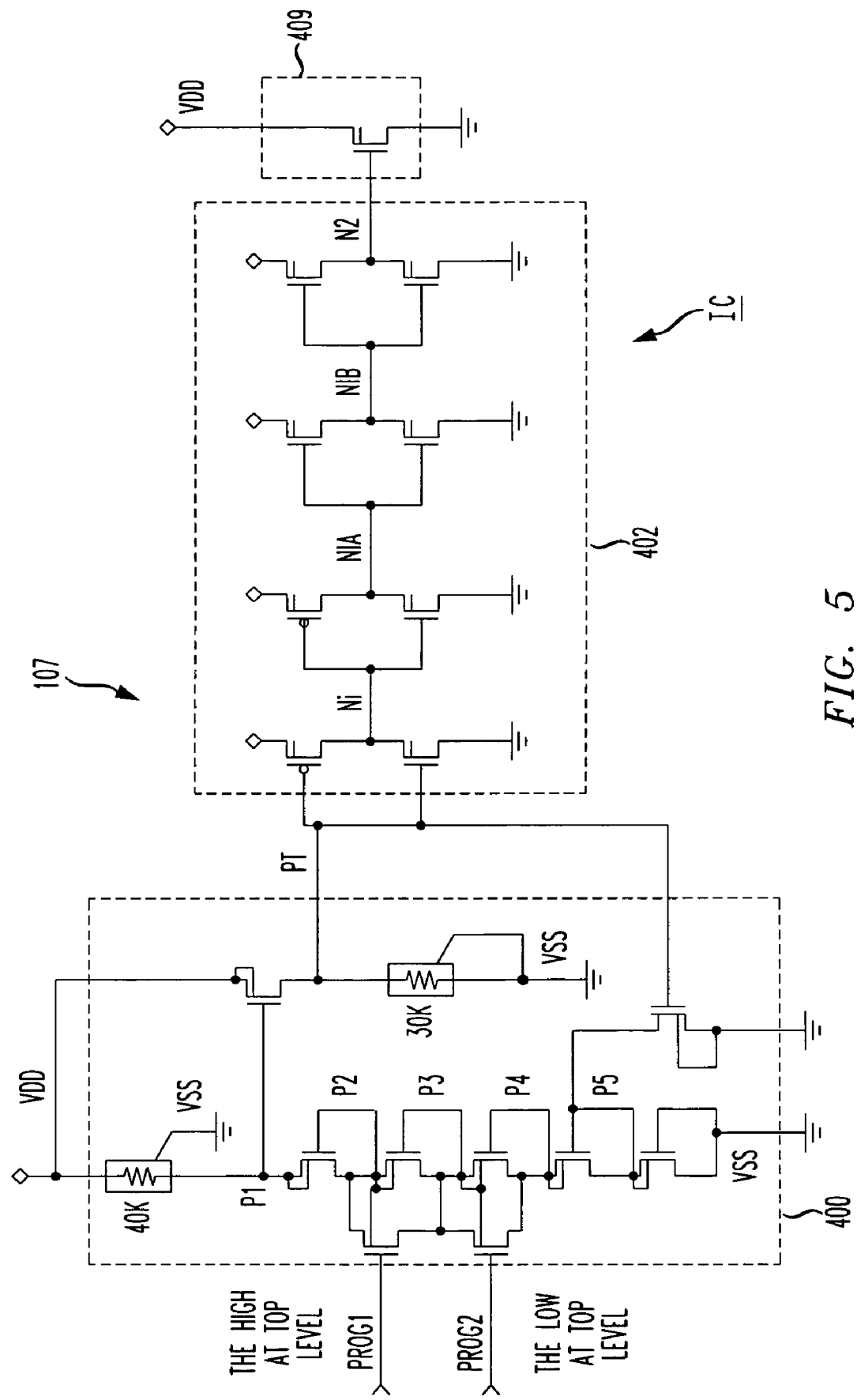
FIG. 5 is a detailed circuit diagram of a portion of an integrated circuit including an exemplary electrical over stress shunt including a detector and trigger portion as well as a driver portion, in accordance with the principles of the present invention.

FIG. 5 is a detailed circuit diagram of an integrated circuit including an exemplary electrical over stress shunt including a detector and trigger portion as well as a driver portion, in accordance with the principles of the present invention.

The EOS shunt 107 as shown in FIGS. 1 and 5 is preferably placed next to each power pad during integrated circuit design, and fabricated there during fabrication of the integrated circuit, providing a maximum amount of robust protection for the integrated circuit from damage due to EOS events.

While the invention has been described with reference to the exemplary embodiments and process technologies, those skilled in the art will be able to make various modifications to the described embodiments and process technologies of the invention without departing from the true spirit and scope of the invention.

What is claimed is:

1. Circuitry including an electrical over stress (EOS) shunt connected between a first rail and a second rail of the circuitry, the EOS shunt comprising:

a switchable low-resistance path connected between the first and second rails; and a voltage threshold detector comprising a plurality of series-connected diodes connected in series with a resistor between the first and second rails, wherein:

the voltage threshold detector is coupled to turn on and off the switchable low-resistance path based on relative voltage levels of the first and second rails;

the voltage threshold detector further comprises at least one switch connected to selectively bypass at least one of the series-connected diodes; and the resistor is a programmable resistor whose resistance can be selectively changed when the at least one series-connected diode is bypassed.

2. The circuitry of claim 1, wherein:
the first rail is a power rail; and
the second rail is a ground rail.

3. The circuitry of claim 1, wherein the circuitry is implemented in a single integrated circuit.

4. The circuitry of claim 1, further comprising an electrostatic discharge (ESD) shunt connected between the first and second rails in parallel with the EOS shunt, wherein:
the ESD shunt is designed to protect the circuitry from ESD events; and
the EOS shunt is designed to protect the circuitry from EOS events having durations longer than the ESD events.

5. The circuitry of claim 1, wherein bypassing one or more of the series-connected diodes changes the relative voltage levels at which the switchable low-resistance path is turned on.

6. The circuitry of claim 1, wherein the voltage threshold detector comprises at least two switches connected to selectively bypass up to at least two of the series-connected diodes.

7. The circuitry of claim 1, wherein the EOS shunt further comprises a driver connected between the voltage threshold detector and the switchable low-resistance path.

8. The circuitry of claim 7, wherein the driver comprises one or more series-connected inverters.

9. The circuitry of claim 1, wherein the switchable low-resistance path comprises a transistor whose channel is connected between the first and second rails and whose gate is coupled to the voltage threshold detector.

10. The circuitry of claim 1, further comprising a Firewire IEEE 1394 interface.

11. The circuitry of claim 1, wherein:
the first rail is a power rail;
the second rail is a ground rail;
the circuitry is implemented in a single integrated circuit;
the circuitry further comprises an ESD shunt connected between the first and second rails in parallel with the EOS shunt, wherein:
the ESD shunt is designed to protect the circuitry from ESD events; and
the EOS shunt is designed to protect the circuitry from EOS events having durations longer than the ESD events;
bypassing one or more of the series-connected diodes changes the relative voltage levels at which the switchable low-resistance path is turned on;
the EOS shunt further comprises a driver connected between the voltage threshold detector and the switchable low-resistance path, wherein the driver comprises one or more series-connected inverters; and
the switchable low-resistance path comprises a transistor whose channel is connected between the first and second rails and whose gate is coupled to the voltage threshold detector.

12. The circuitry of claim 11, wherein the voltage threshold detector comprises at least two switches connected to selectively bypass up to at least two of the series-connected diodes.

13. The circuitry of claim 11, further comprising a Firewire IEEE 1394 interface.

* * * * *